United States Patent [19]

Tomisawa

[11] Patent Number: 5,039,893
[45] Date of Patent: Aug. 13, 1991

[54] SIGNAL DELAY DEVICE

[75] Inventor: Norio Tomisawa, Hamamatsu, Japan

[73] Assignee: Yamaha Corporation, Hamamatsu, Japan

[21] Appl. No.: 448,056

[22] Filed: Dec. 8, 1989

Related U.S. Application Data

[60] Division of Ser. No. 289,479, Dec. 21, 1988, which is a continuation of Ser. No. 760,332, Jul. 29, 1985, abandoned.

[30] Foreign Application Priority Data

Jul. 31, 1984 [JP] Japan ................... 59-160784

[51] Int. Cl.[5] ............................................. H03K 5/13
[52] U.S. Cl. ................................ 307/597; 307/592; 307/594; 331/2; 331/25
[58] Field of Search ............. 307/451, 452, 469, 481, 307/573, 575, 579, 585, 264, 521, 592, 594, 597, 601, 602, 603, 605, 296.6, 296.8, 297, 263; 331/2, 8, 10, 25, 34, 57; 329/127, 128; 332/16 R

[56] References Cited

U.S. PATENT DOCUMENTS

| | | | |
|---|---|---|---|
| 3,914,702 | 10/1975 | Gehweiler | 330/13 |
| 3,931,588 | 1/1976 | Gehweiler | 331/57 |
| 3,996,481 | 12/1976 | Chu et al. | 307/279 |
| 4,072,910 | 2/1978 | Dingwall et al. | 331/57 |
| 4,131,861 | 12/1978 | Malaviya | 331/2 |
| 4,473,762 | 9/1984 | Iwahashi et al. | 307/443 |
| 4,482,826 | 11/1984 | Ems et al. | 307/494 |
| 4,494,021 | 1/1985 | Bell et al. | 331/57 |
| 4,514,647 | 4/1985 | Shoji | 307/269 |
| 4,567,448 | 1/1986 | Ikeda | 331/25 |
| 4,585,955 | 4/1986 | Uchida | 307/443 |
| 4,603,301 | 7/1986 | Dukes et al. | 333/165 |
| 4,638,184 | 1/1987 | Kimura | 323/311 |
| 4,760,279 | 7/1988 | Saito et al. | 307/443 |

FOREIGN PATENT DOCUMENTS 0103371  9/1978  Japan .................. 307/451

Primary Examiner—Stanley D. Miller
Assistant Examiner—T. Cunningham
Attorney, Agent, or Firm—Spensley Horn Jubas & Lubitz

[57] ABSTRACT

A signal delay device comprises a CMOS gate circuit having an input terminal to which a binary input signal to be delayed is applied, an output terminal from which a delayed signal is derived and power voltage supply terminals to which operation power voltages are applied. The delay time of the CMOS gate circuit depends upon voltage applied to it and, utilizing this phenomenon, voltage control means is provided in a power supplying path for the CMOS gate circuit for controlling voltage applied to the CMOS gate circuit. The signal delay device using the CMOS gate circuit is applied to a combination of an FM modulator and FM demodulator to provide a delay circuit for an analog circuit.

7 Claims, 13 Drawing Sheets

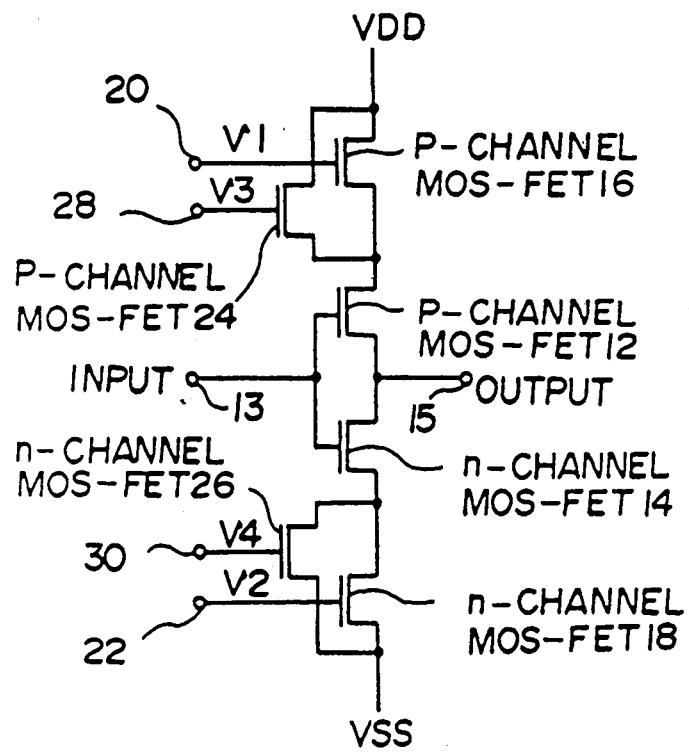
F I G. 7
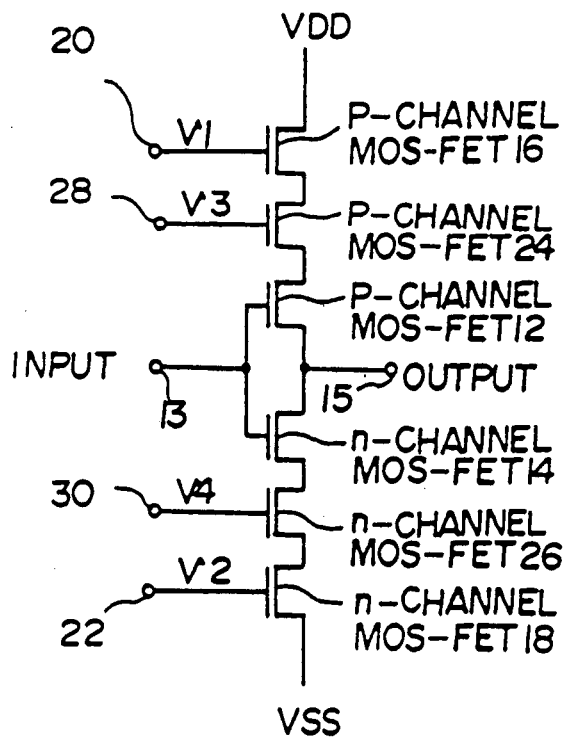
F I G. 8

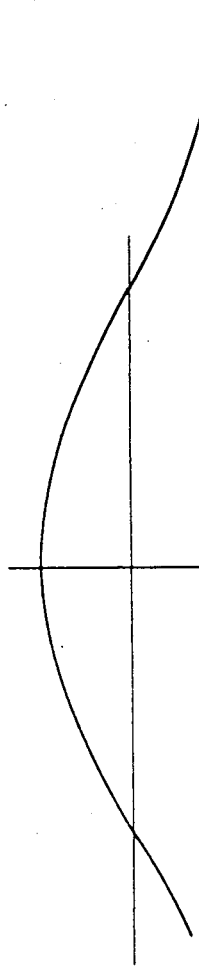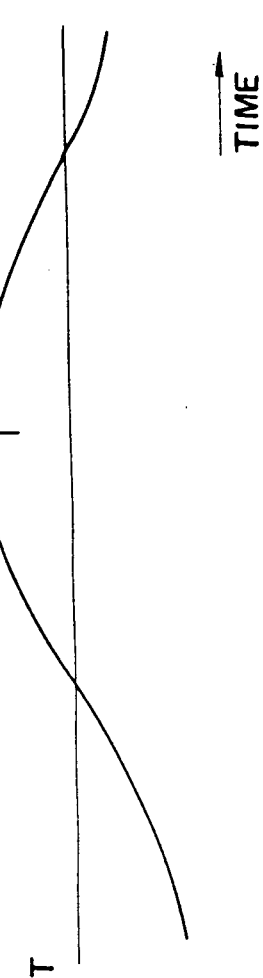
FIG. 23a ANALOG INPUT TO INPUT TERMINAL 119
FIG. 23b OUTPUT OF FM CKT. 120
FIG. 23c OUTPUT OF DELAY CKT. 138
FIG. 23d ANALOG OUTPUT FROM OUTPUT TERMINAL 168
T: DELAY TIME
TIME

SIGNAL DELAY DEVICE

This is a division of application Ser. No. 07/289,479, filed on Dec. 21, 1988 which is a continuation of Ser. No. 06/760,332, filed July 29, 1985, now abandoned.

BACKGROUND OF THE INVENTION

This invention relates to a signal delay device a delay time of which can be controlled easily.

Known in the art of a signal delay circuit are various circuits such, for example, as a physical delay line, a distributed constant circuit, a bucket-brigade device (BBD), a charge-coupled device (CCD), and a shift register and a program control utilizing a random-access memory (RAM) in a digital system.

In various circuits to which a signal delay circuit is applied, there is a technical demand for arbitrarily varying a delay time of the delay circuit. Such arbitrary variation of the delay time can hardly be achieved by a delay line or a distributed constant circuit and, for this purpose, a bucket-brigade device, a charge-coupled device, a shift register or like device which uses a clock pulse for transmission of a signal is generally employed to control the frequency of the clock pulse.

In such delay system utilizing a clock pulse for transmission of a signal, a signal is sampled by a clock pulse and, accordingly, resolution of the system along the time axis is determined by the clock period. As a result, in a case where, for example, a pulse frequency modulation signal containing analog data along the time axis is to be delayed, a phase error tends to occur in the delay output. This defect can theoretically be eliminated by employing a very fast clock and thereby improving the resolution. This requires, however, increase in the number of stages of a delay element such as a bucket-brigade device, a charge-coupled device or a shift register with resulting difficulties in the circuit design and increase in the manufacturing costs.

It is, therefore, a first object of the invention to provide a signal delay device a delay time of which can be readily controlled without causing a phase error.

For achieving this object, the invention utilizes the phenomena that a CMOS gate has a delay time between its input and output terminals and this delay time changes depending upon voltage applied thereto.

The delay time of the CMOS gate depends upon power voltage and temperature. The smaller the power voltage, the longer the delay time and the larger the rate of change. As to the temperature, the higher the temperature, the longer the delay time. This is because conductance of the element of the CMOS gate changes due to the power voltage and temperature. Since dependency of the delay time upon the power voltage and temperature is too large to be ignored and influences of these factors are observed as instability in the oscillation period in an oscillation circuit and increase in distortion in the transmission system, it has been difficult to use the CMOS gate as a delay circuit in a circuit which requires a precision control. For overcoming such difficulty, it is conceivable to use a strictly stabilized power source and provide the CMOS gate in a thermostatic oven. This will however require a bulky and costly circuitry.

It is, therefore, a second object of the invention to provide a delay time stabilizing circuit capable of accurately stabilizing the delay time of the delay circuit utilizing the CMOS gate with a simple construction.

The above described delay circuit utilizing the CMOS gate is applicable to various circuits and devices. One of them is an analog delay circuit.

As described above, the prior art analog delay circuit using a bucket-brigade device, a charge-coupled device, a shift register or the like device uses a clock pulse for transmitting a signal. Since a signal is sampled by a clock pulse in this type of delay circuit, resolution in the time axis is determined by the clock period with a result that the distortion factor increases. Further, although the delay time can be changed by changing the clock period in this type of delay circuit, resolution also is caused to change with the change of the clock period.

It is, therefore, a third object of the invention to provide an analog delay circuit capable of delaying an analog signal with a high resolution and a low distortion factor and also capable of changing the delay time continuously without changing the resolution by employing the delay circuit using the CMOS gate.

SUMMARY OF THE INVENTION

The first object of the invention is achieved by providing a voltage control means for controlling voltage applied to a CMOS gate circuit between the gate circuit and its power sources so that the signal delay time between an input terminal and an output terminal of the gate circuit can be controlled by this voltage control means.

According to the invention, by utilizing the phenomena that the CMOS gate has a delay time between its input and output terminals and that the delay time changes depending upon applied voltage, the delay time can be readily controlled by changing applied voltage. Besides, since an original signal is not transmitted through sampling by a clock pulse as in the prior art delay circuits using the bucket-brigade device, charge-coupled device, shift register and the like but is continuously delayed in its original form, any signal including one having analog data along the time axis such as a pulse frequency modulation signal can be delayed without causing a phase error.

The second object of the invention is achieved by providing means for producing an analog voltage corresponding to the delay time of the CMOS gate circuit and means for supplying this voltage as operation voltage for the CMOS gate circuit thereby to stabilize the delay time of the CMOS gate circuit.

According to this delay time stabilizing circuit, the delay time can be stabilized readily and accurately without using a strictly stabilized power source and a thermostatic oven.

The third object of the invention is achieved by providing an analog delay circuit which comprises a frequency modulation circuit for pulse frequency-modulating an input analog signal, a delay circuit using a CMOS gate for delaying an output signal of the frequency modulation circuit and a frequency demodulation circuit for frequency-demodulating an output signal of the delay circuit.

According to this analog delay circuit, a high resolution is realized since no clock is used for delaying of an analog signal and moreover a continuous control of the delay time is available by controlling the power voltage applied to the CMOS gate.

BRIEF DESCRIPTION OF THE DRAWINGS

In the accompanying drawings,

FIGS. 7 through 15 are respectively circuit diagrams showing other embodiments of the delay circuit according to the invention;

FIGS. 23a–23d are waveshape diagrams showing the operation of the circuit of FIG. 22;

DESCRIPTION OF PREFERRED EMBODIMENTS

I. Delay Circuit Utilizing a CMOS Gate

Figure 2:
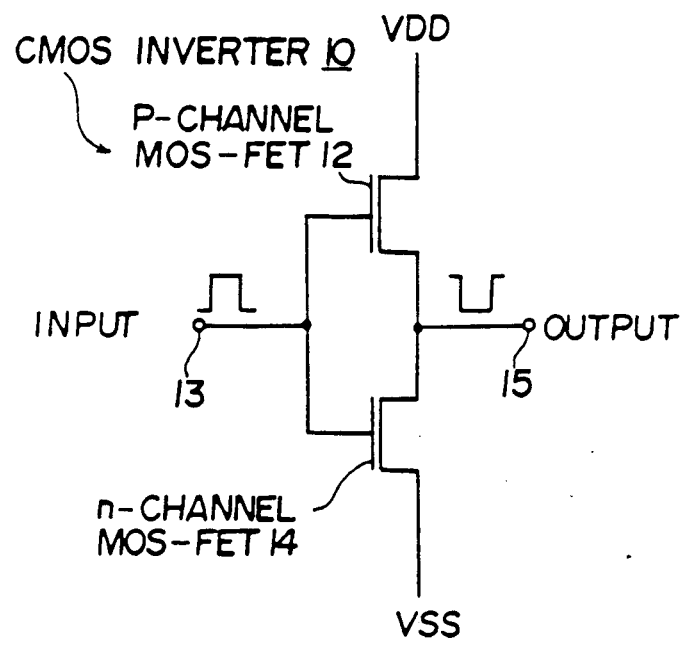
FIG. 2 is a circuit diagram showing a CMOS gate circuit.

An example of a CMOS gate is shown in FIG. 2. A p-channel MOS-FET 12 and an n-channel MOS-FET 14 are connected in their gates and drains together and power voltages $V_{DD}-V_{SS}$ are respectively applied to their sources. A signal is applied to their gates through an input terminal 13 and an inverted signal of the input signal is produced from an output terminal 15 through their drains.

Figure 3:
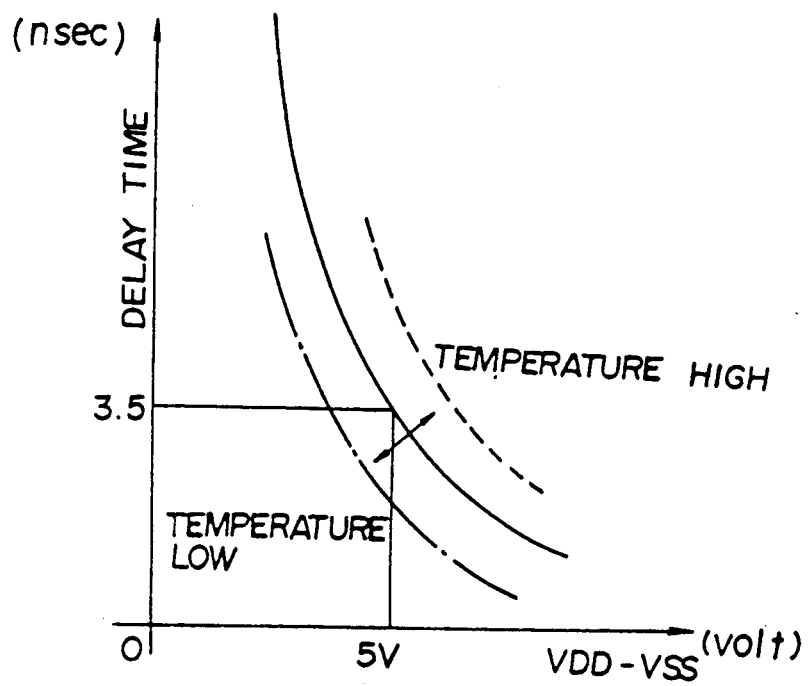
FIG. 3 is a diagram showing power voltage-delay time characteristics in the CMOS gate shown in FIG. 2.

In this CMOS inverter 10, there occurs a delay time between its input and output. This delay time depends, as shown in FIG. 3, upon the power voltage $V_{DD}-V_{SS}$. The smaller the power voltage $V_{DD}-V_{SS}$, the greater the delay time and the rate of change thereof. This is because conductance of the element changes depending upon the power voltage $V_{DD}-V_{SS}$. Accordingly, a desired length of delay time can be obtained by controlling the delay time in accordance with the magnitude of the power voltage $V_{DD}-V_{SS}$, utilizing the above described property.

Figure 4:
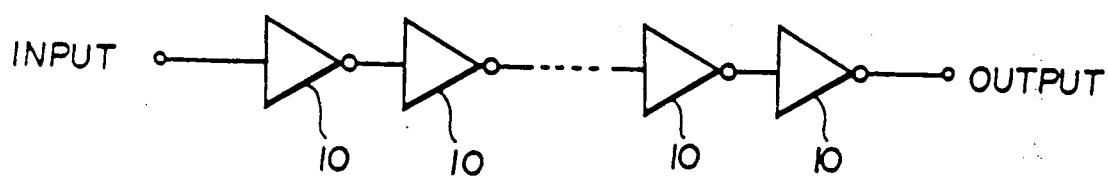
FIG. 4 is a circuit diagram showing a circuit capable of obtaining a long delay time by cascade-connecting CMOS inverters 10 of FIG. 2 in plural stages.
Figures 5, 6:
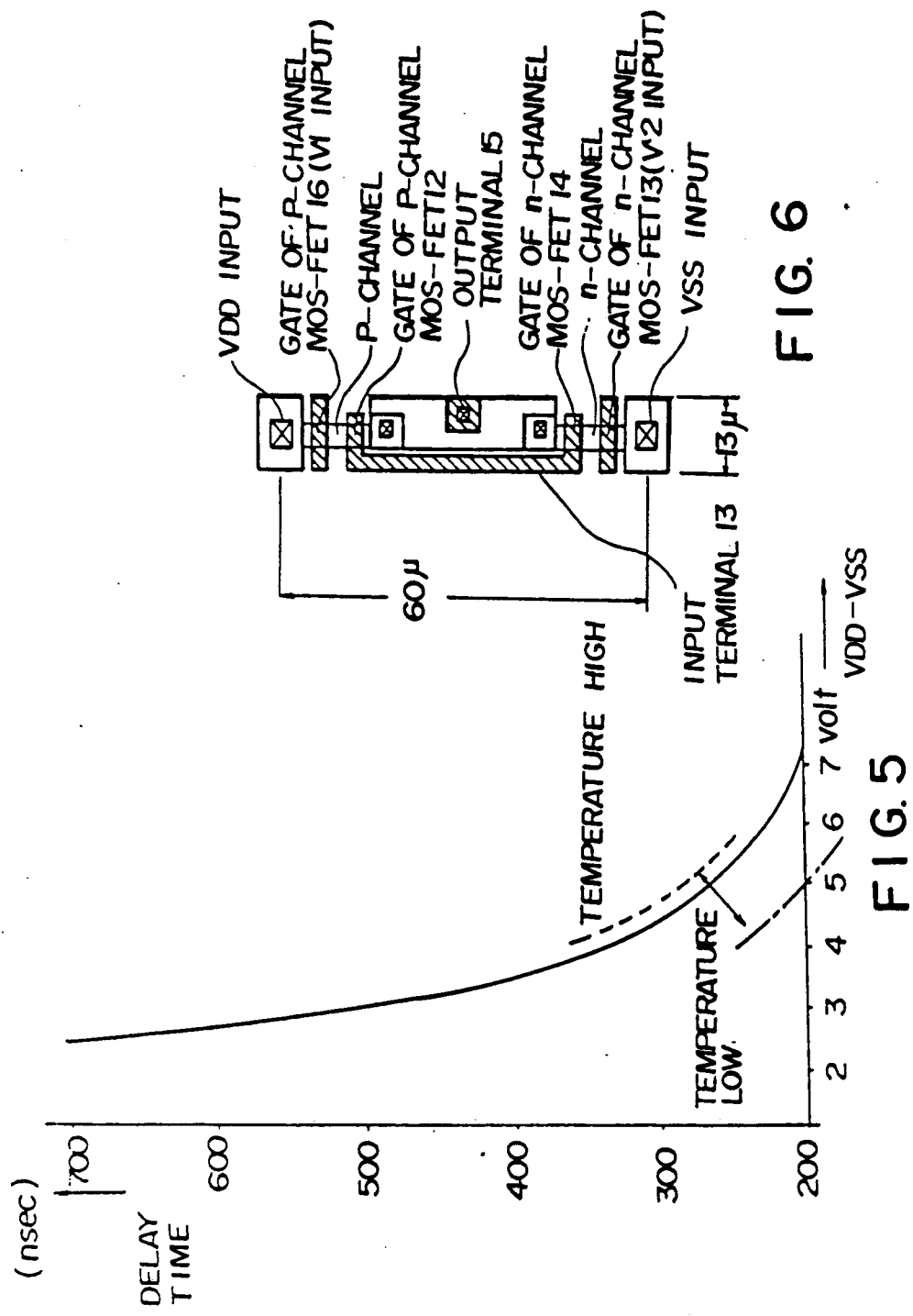
FIG. 5 is a diagram showing power voltage-delay time characteristics of a circuit in which the CMOS inverters 10 shown in FIG. 2 are cascade-connected in 80 stages.
FIG. 6 is an example of the circuit of FIG. 1 formed in an integrated circuit.

Further, if a plurality of the CMOS inverters 10 are cascade-connected as shown in FIG. 4, a longer delay time can be obtained. If, for example, delay time of about 3.5 (nsec) per stage is obtained at the power voltage $V_{DD}-V_{SS}$ of 5 (V) and the CMOS inverters 10 are connected in 8,000 stages, a delay time of $8,000 \times 3.5$ (nsec)$\simeq 28$ ($\mu$sec) can be obtained. Power voltage $V_{DD}-V_{SS}$ v. delay time characteristics in case 80 CMOS inverters 10 are cascade-connected are shown in FIG. 5. It will also be noted from FIGS. 3 and 5 that the delay time of the CMOS inverter 10 depends also upon temperature, the delay time increasing as temperature rises to cause conductance change in elements.

Figure 1:
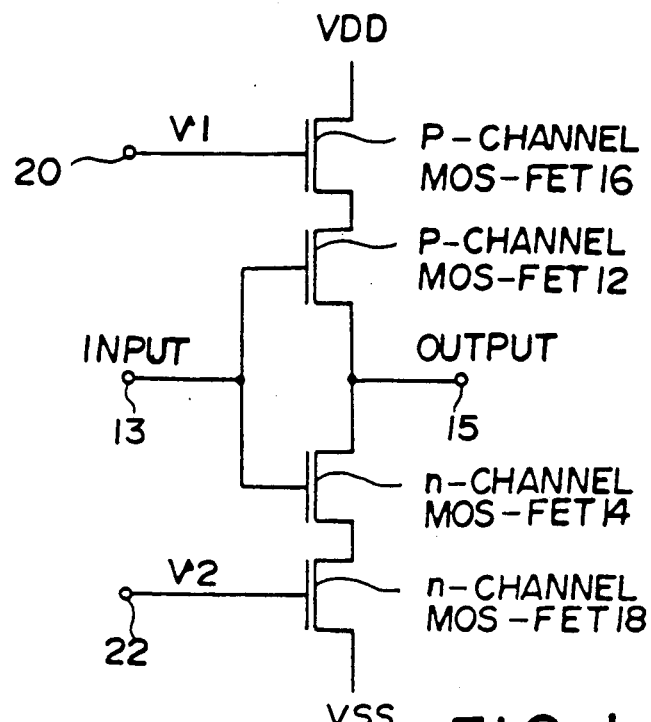
FIG. 1 is a circuit diagram showing an embodiment of the delay circuit according to the invention.

An embodiment of the invention is shown in FIG. 1. In this embodiment, delay time control elements are inserted between the CMOS gate and its power sources.

In FIG. 1, a p-channel MOS-FET 12 and an n-channel MOS-FET 14 are connected in their gates and drains together and a signal is applied from their gates and delivered out from their drains. A p-channel MOS-FET 16 and an n-channel MOS-FET 18 are inserted as delay time control elements between the source of the p-channel MOS-FET 12 and the power source $V_{DD}$ and between the source of the n-channel MOS-FET 14 and the power source $V_{SS}$. To the gates of the p-channel MOS-FET 16 and the n-channel, MOS-FET 18 are applied control voltages v1 and v2 from terminals 20 and 22. These control voltages v1 and v2 are set at values which are symmetrical to the reference voltages $V_{DD}-V_{SS}$ (i.e., $V_{DD}-v1=v2-V_{SS}$). By controlling the values of the control voltages v1 and v2, voltages applied to the p-channel MOS-FET 12 and n-channel MOS-FET 14 which constitute the CMOS inverter are caused to change with resulting change in the delay time. The smaller the value of $V_{DD}-v1=v2-V_{SS}$, the greater the voltage applied to the MOS-FETs 12 and 14 and the smaller the delay time, while the greater the value of $V_{DD}-v1=v2-V_{SS}$, the smaller the voltage applied to the MOS-FETs 12 and 14 and the greater the delay time.

An example of the circuit of FIG. 1 formed in an integrated circuit pattern is shown in FIG. 6. By using this integrated circuit pattern, the multi-stage connection can be facilitated.

FIG. 7 shows an embodiment in which the delay time control elements are provided in two channels. In this embodiment, a p-channel MOS-FET 24 and an n-channel MOS-FET 26 are connected in parallel to the p-channel MOS-FET 16 and n-channel MOS-FET 18 in the circuit of FIG. 1. To the gates of the p-channel MOS-FET 24 and n-channel MOS-FET 26 are applied control voltages v3 and v4 from terminals 28 and 30. The delay time can be controlled in two systems by the voltages v1 and v2 from the terminals 20 and 22 and the voltages v3 and v4 from the terminals 28 and 30. This embodiment can be utilized in a case where, for example, coarse control signals are applied to the terminals 20 and 22 and fine control signals are applied to the terminals 28 and 30. The two channel control voltages may be separately applied by means of manual operation or control voltage generating circuit. This two channel control may be applied so that one channel is used for stabilization control of the delay time against the variations of the power voltages $V_{DD}$, $V_{SS}$ and the temperature, while the other channel is used for variable control of the delay time.

FIG. 8 shows an embodiment in which the p-channel MOS-FET 16 and the p-channel MOS-FET 24 on one hand and the n-channel MOS-FET 18 and n-channel MOS-FET 26 on the other are respectively connected in series. In this embodiment also, the delay time can be controlled in two channels by the voltages v1 and v2 applied to the terminals 20 and 22 and the voltages v3 and v4 applied to the terminals 28 and 30.

Figure 9:
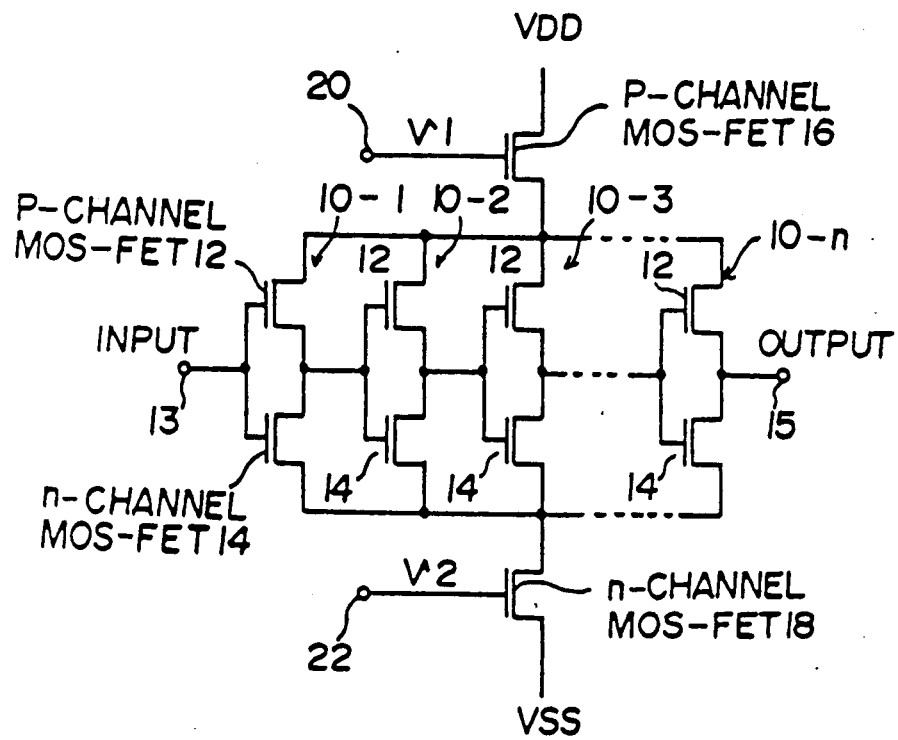

FIG. 9 shows an embodiment in which the invention is applied to CMOS inverters 10-1 through 10-n connected in plural stages. In these CMOS inverters, a drain output of a preceding stage is applied to a gate of a next stage. The power voltages $V_{DD}$ and $V_{SS}$ are supplied to the respective p-channel MOS-FET's 12 and the n-channel MOS-FET's 14 constituting the CMOS inverters 10-1 through 10-n via the p-channel MOS-FET 16 and the n-channel MOS-FET 18. According to this construction, the delay time can be controlled by the delay time control MOS-FET's 16 and 18.

Figure 10:
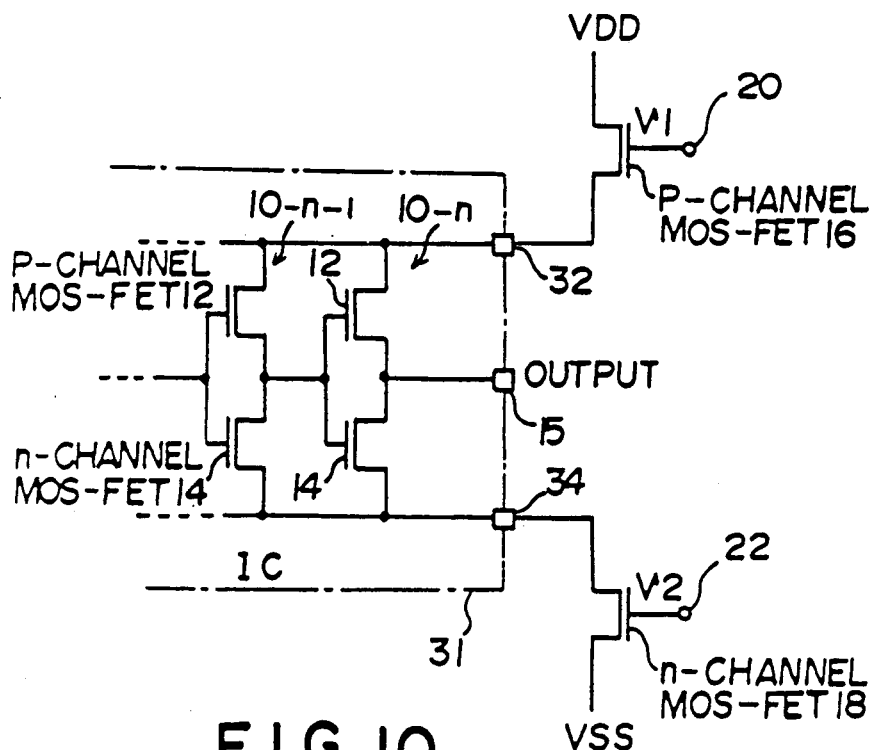

FIG. 10 shows an embodiment in which the invention is applied to an arrangement of the CMOS inverters 10-1 through 10-n of plural stages formed in an integrated circuit 31. The delay time control elements are connected to the exterior of the integrated circuit 31. More specifically, the p-channel MOS-FET 16 and n-channel MOS-FET 18 are connected to power source terminals 32 and 34 which in turn are connected to the sources of the CMOS inverters 10-1 through 10-n and the power voltages $V_{DD}$ and $V_{SS}$ are applied to the CMOS inverters 10-1 through 10-n via the MOS-FET's 16 and 18.

Figure 11:
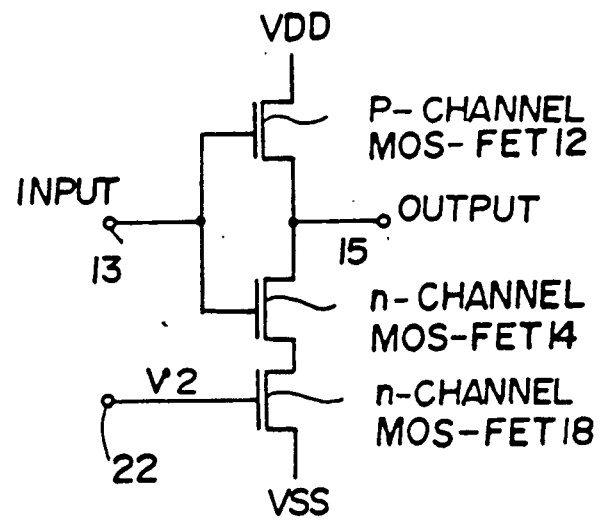

In the above described embodiments, the control elements are provided on both sides of the power sources. A similar effect can be obtained by providing the control element on one side only. FIG. 11 shows one example of such construction. This embodiment is equivalent to the embodiment of FIG. 1 except that the p-channel MOS-FET 16 is deleted. The delay time control is effected by the n-channel MOS-FET 18 only. Similarly, it is possible to delete the n-channel MOS-FET 18 in the embodiment of FIG. 1.

Figure 12:
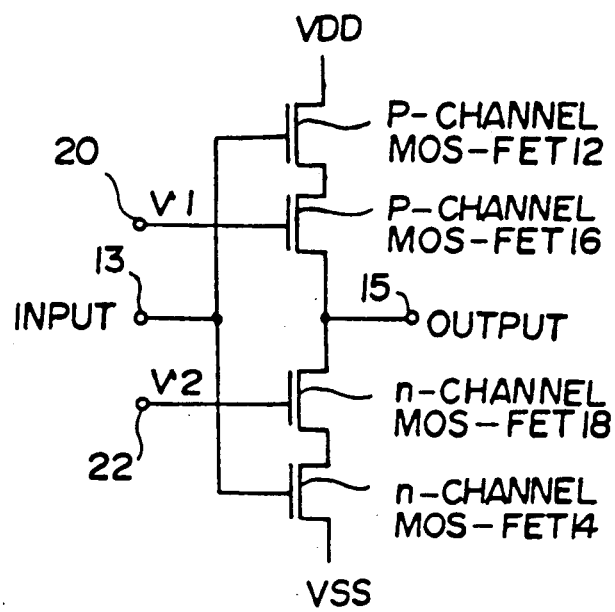

In the above described embodiments, the control elements are provided outside of the CMOS inverter. Alternatively, the control elements, however, may be provided inside of the CMOS inverter. FIG. 12 shows one example of such construction. In the construction of FIG. 12, the CMOS inverter is composed of the p-channel MOS-FET 12 and the n-channel MOS-FET 14 and the delay time control p-channel MOS-FET 16 and n-channel MOS-FET 18 are provided inside of this CMOS inverter.

Figure 13:
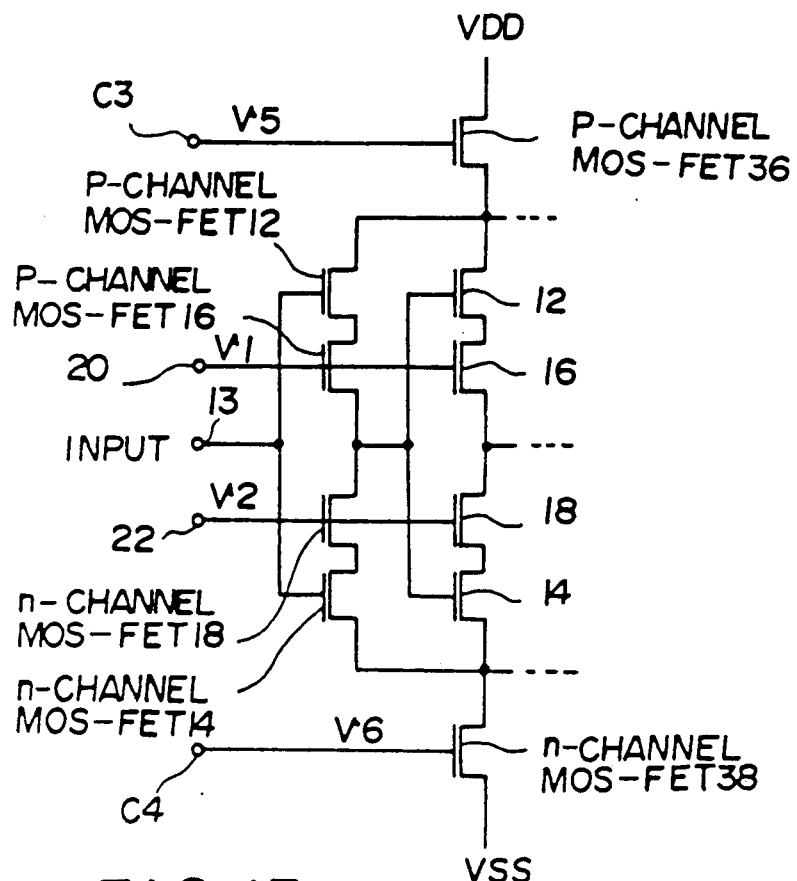

FIG. 13 shows an embodiment in which the circuits of FIG. 12 are connected in plural stages and the delay time control p-channel MOS-FET 36 and n-channel MOS-FET 38 are connected outside of these circuits. In this embodiment, the delay time is controlled by the two channels of voltages v1 and v2 applied to the gates of the MOS-FET's 16 and 18 and voltages v5 and v6 applied to the gates of the MOS-FET's 36 and 38 from terminals c3, c4.

Figure 14:
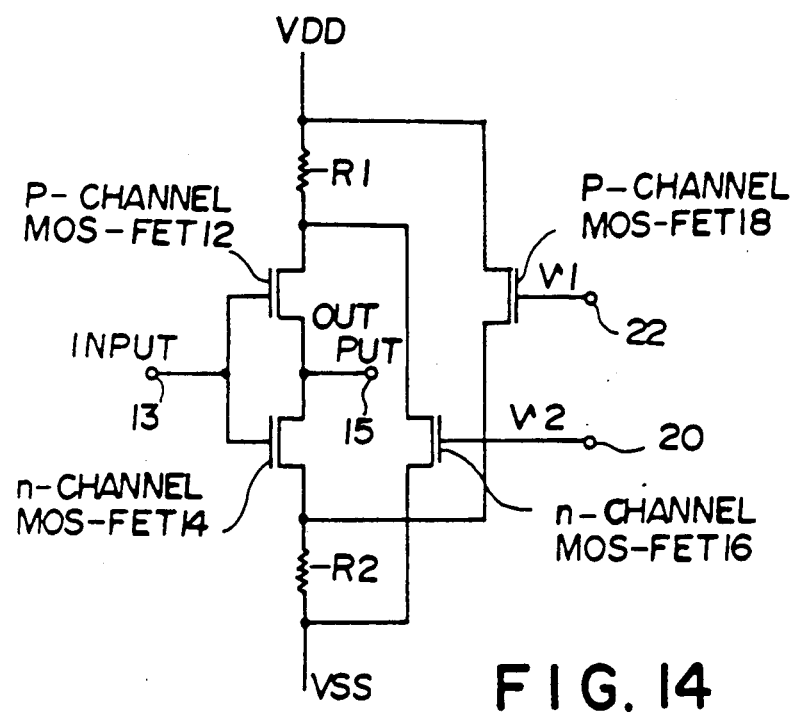

Instead of connecting the control elements to the MOS-FET's 12 and 14 constituting the CMOS inverter in series as in the foregoing embodiments, the control elements may be connected in parallel to these construc- MOS-FET's. FIG. 14 shows one example of such construction. In FIG. 14, the sources of the p-channel MOS-FET 12 and n-channel MOS-FET 14 constituting the CMOS inverter are connected to the power source $V_{DD}$ and $V_{SS}$ via resistors R1 and R2, the delay time control n-channel MOS-FET 16 is connected in parallel to the p-channel MOS-FET 12, n-channel MOS-FET 14 and resistor R2, and the delay time control p-channel MOS-FET 18 is connected in parallel to the resistor R1, p-channel MOS-FET 12 and n-channel MOS-FET 14. The delay time is controlled by voltages v2 and v1 applied to the gates of the n-channel MOS-FET 16 and the p-channel MOS-FET 18. In this case, the relationship between change in the control voltages v1 and v2 and change in the delay time is reverse to the one in the embodiments of FIG. 13 and before.

Figure 15:
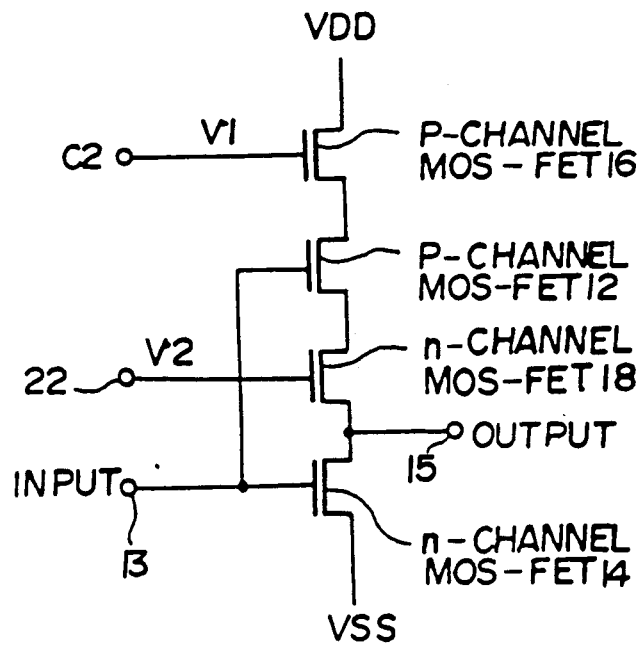

In the inverter shown in FIG. 15, a control n-channel MOS-FET 18 is inserted between MOS-FET's 12 and 14 constituting a CMOS inverter and a control p-channel MOS-FET 16 is inserted between the MOS-FET 12 and power source $V_{DD}$.

II. The Delay Time Stabilizing Circuit

Figure 16:
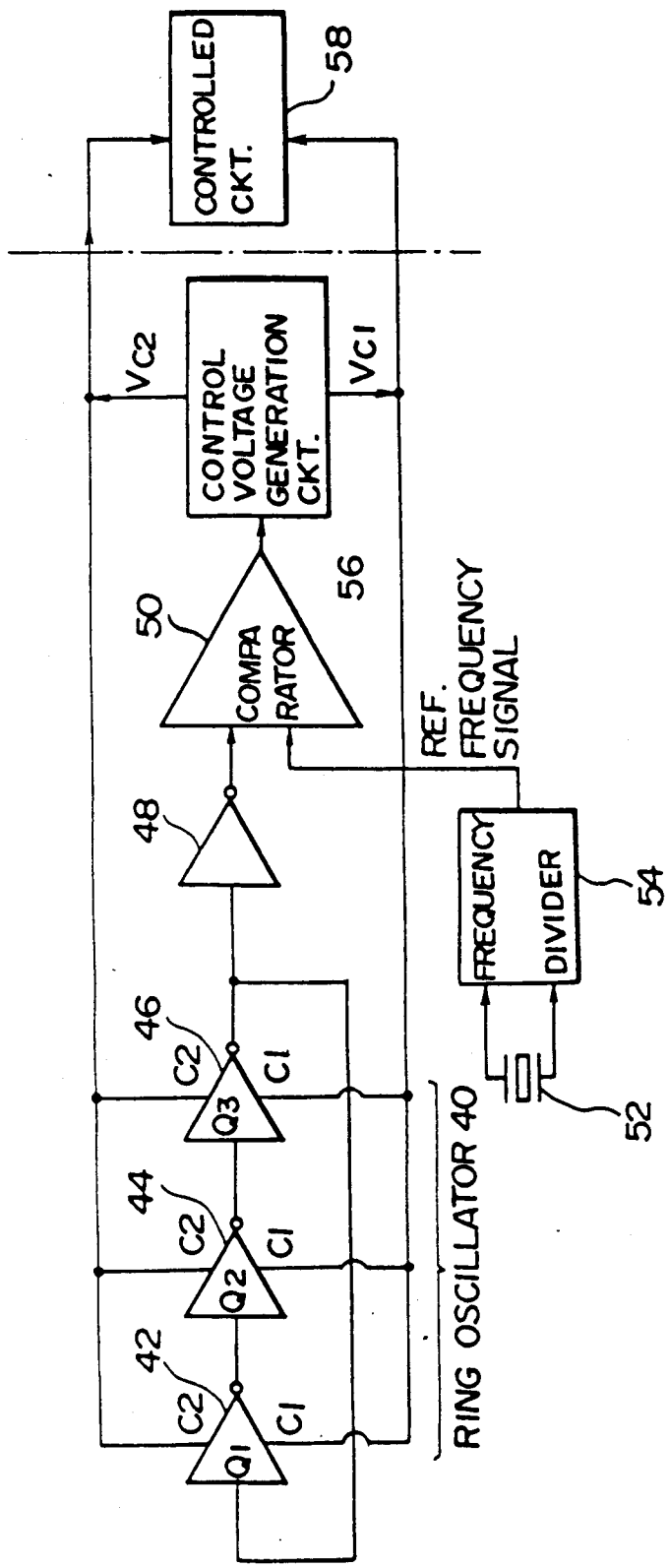
FIG. 16 is a circuit diagram showing an embodiment of the delay time stabilizing circuit according to the invention.

FIG. 16 shows an embodiment of the delay time stabilizing circuit according to the invention. This embodiment is designed for stabilizing the oscillation frequency of a ring oscillator and utilizing the control voltage used for this stabilization for stabilizing other circuits including a CMOS inverter.

In FIG. 16, a ring oscillator 40 utilizes delay characteristics of a CMOS inverter. Inverters 42, 44 and 46 of an odd number are cascade-connected and the output of the inverter 46 of the final stage is fed back to the inverter 42 of the initial stage. The oscillation frequency of the ring oscillator 40 is determined by the delay time of the open loop.

The oscillation output of the ring oscillator 40 is waveshaped by an inverter 48 and thereafter is applied to a comparator 50. The comparator 50 compares, in frequency and phase, this signal with a signal provided by frequency-dividing the output pulse of an oscillator 52 by a frequency divider 54 and produces a signal of a pulse width corresponding to the difference between the two signals.

In a control voltage generation circuit 56, DC voltages Vc1 and Vc2 are generated by smoothing the output pulse of the comparator 50. The DC voltages Vc1 and Vc2 are applied as control voltages to control input terminals c1 and c2 of the inverters 42, 44 and 46 which constitute the ring oscillator 40 to control the applied voltage thereof. Since delay characteristics of the inverters 42, 44 and 46 depend upon the applied voltages, PLL (phase-locked loop) is constructed by constituting a negative feedback loop in the above described loop with a result that a very stable oscillation frequency can be produced by the ring oscillator 40. In other words, the inverters 42, 44 and 46 are controlled to a constant delay time regardless of variations of the power voltage and temperature. The respective CMOS inverters in FIG. 16 can be constructed as shown in FIGS. 1 and 7 through 15.

Besides the stabilization of the oscillation frequency of the ring oscillator 40, if the control voltages Vc1 and Vc2 obtained in the above circuit are supplied as control voltages to other circuit, i.e., a controlled circuit 58 including inverters which is provided in an environment (e.g., temperature) equivalent to the inverters 42, 44 and 46 (e.g., on the same substrate of an integrated circuit), delay characteristics of this controlled circuit 58 can also be stabilized. As the controlled circuit 58, those as shown in FIG. 17 through 20 may be conceived.

Figure 17:
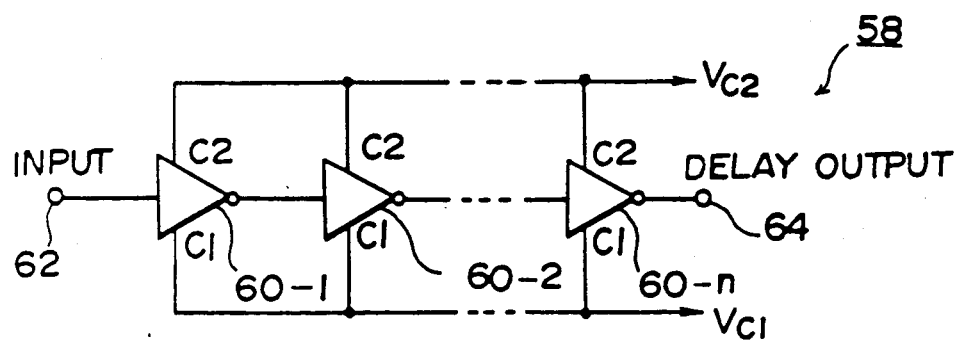
FIGS. 17 through 20 are circuit diagrams showing examples of controlled circuits 58 in FIG. 16 or 21.

FIG. 17 shows a delay circuit in which inverters 60-1, 60-2, ..., 60-n are cascade-connected, a signal is applied to an input terminal 62 and a delay output is provided from an output terminal 64. By controlling voltages applied to the inverters 60-1 through 60-n by means of the control voltages Vc1 and Vc2, the delay time can be maintained at a constant value.

Figure 18:
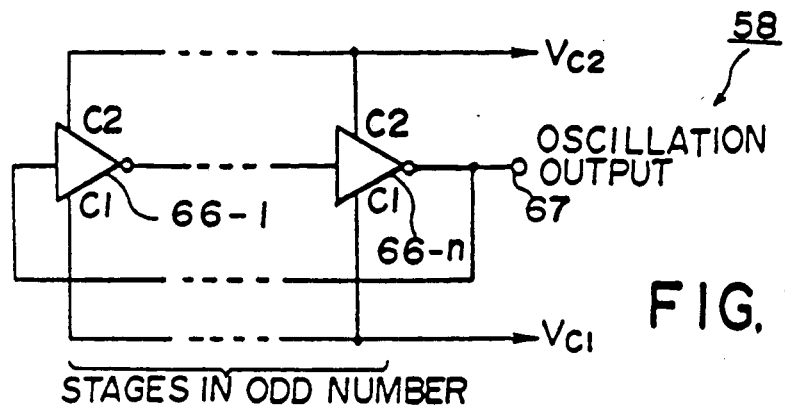

FIG. 18 shows a ring oscillator in which inverters 66-1, ..., 66-n are cascade-connected and an output of the inverter 66-n of the final stage is applied to the inverter 66-1 of the initial stage to produce an oscillation output from an output terminal 67. By controlling voltages applied to the inverters 66-1 through 66-n by the control voltages Vc1 and Vc2, the delay time of the inverters 66-1 through 66-n can be maintained at a constant value and the oscillation frequency can thereby be stabilized.

Figure 19:
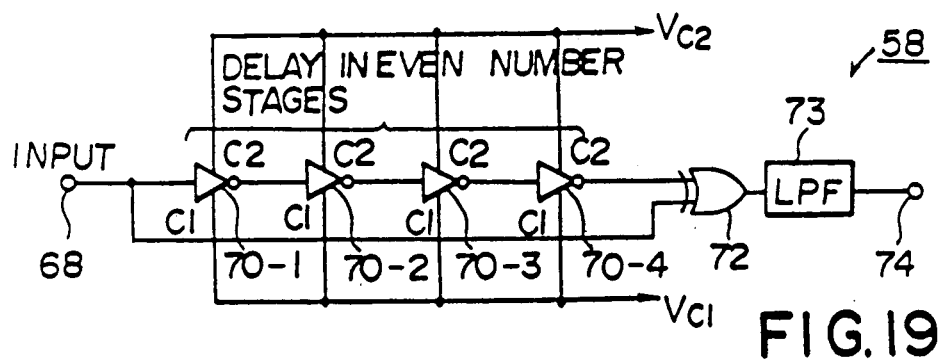

FIG. 19 shows an FM demodulation circuit (a pulse count detection circuit) which comprises cascade-connected inverters 70-1, 70-2, 70-3 and 70-4 of an even number (four in this example). A signal to be demodulated is applied to these inverters through an input terminal 68 and an output signal of the inverter 70-4 of the final stage is applied to an exclusive OR circuit 72. The output of the exclusive OR circuit 72 is taken out through a low-pass filter 73 and delivered to an output terminal 74 as a demodulated signal. An accurate demodulation with little distortion can be made by controlling voltages applied to the inverters 70-1 through 70-4 by the control voltages Vc1 and Vc2.

Figure 20:
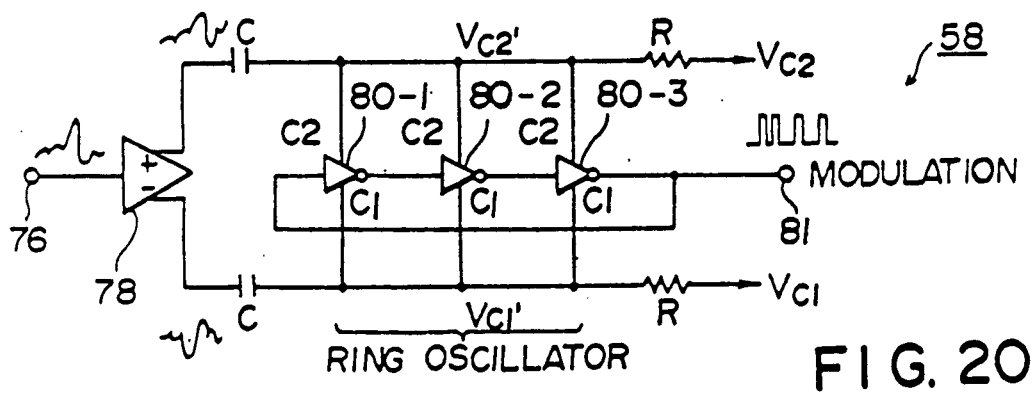

FIG. 20 shows an example of an FM modulation circuit. In this circuit, a signal to be modulated is applied from an input terminal 76 and supplied to an amplifier 78. Control voltages Vc1 and Vc2 are modulated by this input signal and the modulated control voltages Vc1' and Vc2' are used for controlling voltages applied to inverters 80-1, 80-2 and 80-3 constituting a ring oscillator whereby an FM modulated output is provided from the final stage inverter 80-3 to an output terminal 81. By the use of the above control voltages Vc1 and Vc2, an accurate modulation with little variation in the carrier frequency can be performed.

The respective CMOS inverters in FIGS. 17 through 20 can be constructed also as shown in FIGS. 1 and 7 through 15.

Figure 21:
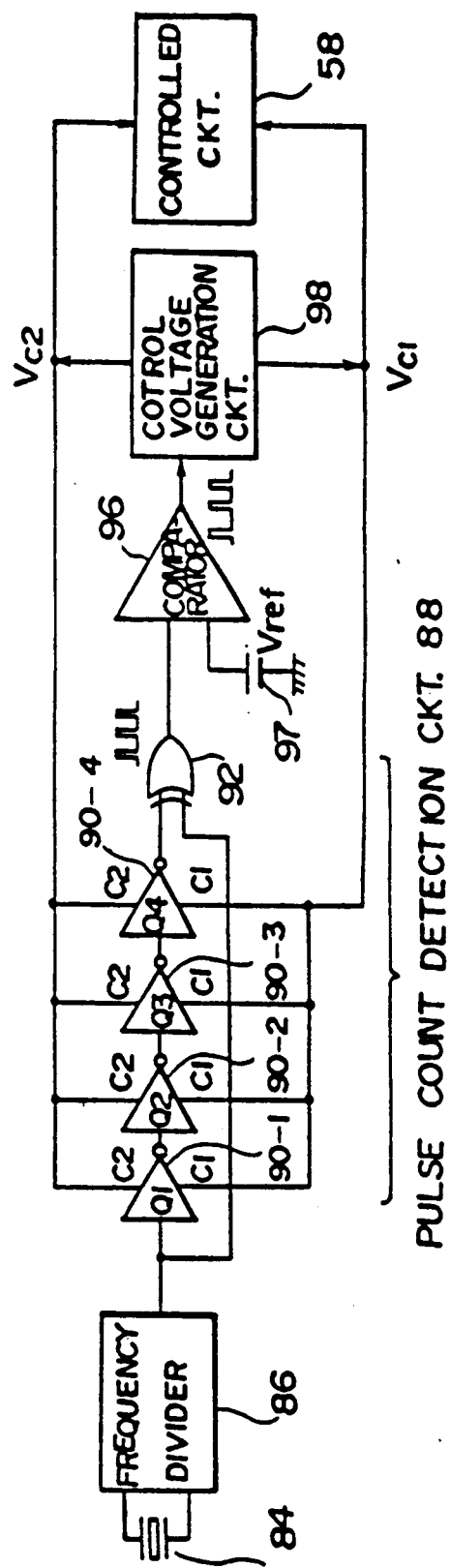
FIG. 21 is a circuit diagram showing another embodiment of the delay time stabilizing circuit.

Another embodiment of the delay time stabilizing circuit is shown in FIG. 21. In this embodiment, a pulse count detection circuit is utilized for stabilizing the delay time.

In FIG. 21, a reference signal generated by a crystal oscillator 84 is frequency-divided by a frequency divider 86 and thereafter is applied to a pulse count detection circuit 88. This circuit 88 comprises cascade-connected inverters 90-1 through 90-4. A frequency-divided signal from the frequency divider 86 is applied to the inverter 90-1 of the initial stage and the output of the inverter 90-4 of the final stage and the output of the frequency divider 86 are applied to an exclusive OR circuit 92. An output pulse from the exclusive OR circuit 92 undergoes change in its pulse width depending upon the delay time of the inverters 90-1 through 90-4.

The output pulse of the exclusive OR circuit 92 whose reference level undergoes change is compared with a constant reference voltage $V_{ref}$ of a reference voltage source 97 by a comparator 96 for eliminating the variation of its level by level shifting.

A control voltage generation circuit 98 smoothes the output pulse of the comparator 96 and thereby generates control voltages Vc1 and Vc2. These control voltages Vc1 and Vc2 are applied to control input terminals c1 and c2 of the inverters 90-1 through 90-4 to control voltages applied to these inverters. Since the delay characteristics of the inverters 90-1 through 90-4 depend upon the applied voltages as described above, a pulse of a constant pulse width is provided from the exclusive OR circuit 92 as a detection output by providing a negative feedback loop in the above described manner. That is, the delay time of the inverters 90-1 through 90-4 is controlled at a constant value regardless of the power voltage and temperature.

The control voltages Vc1 and Vc2 produced by the control voltage generation circuit 98 are applied to a controlled circuit 58. The controlled circuit 58 which is the control object consists of a circuit employing inverters such as a delay circuit, oscillation circuit, FM demodulation circuit and FM modulation circuit as shown in FIGS. 17 through 20. Accordingly, if the inverters employed in the controlled circuit 58 are formed in the same integrated circuit as the inverters 90-1 through 90-4, the inverters in the controlled circuit 58 are controlled commonly with the inverters 90-1 through 90-4 in the pulse count detection circuit 88 so that the delay time of the inverters in the controlled circuit 58 can be controlled at a constant value. Thus, the controlled circuit 58 operates in a stabilized state. Also in this embodiment, the inverters as shown in FIGS. 1 and 7 through 15 can be used.

III. The Analog Delay Circuit

Figure 22:
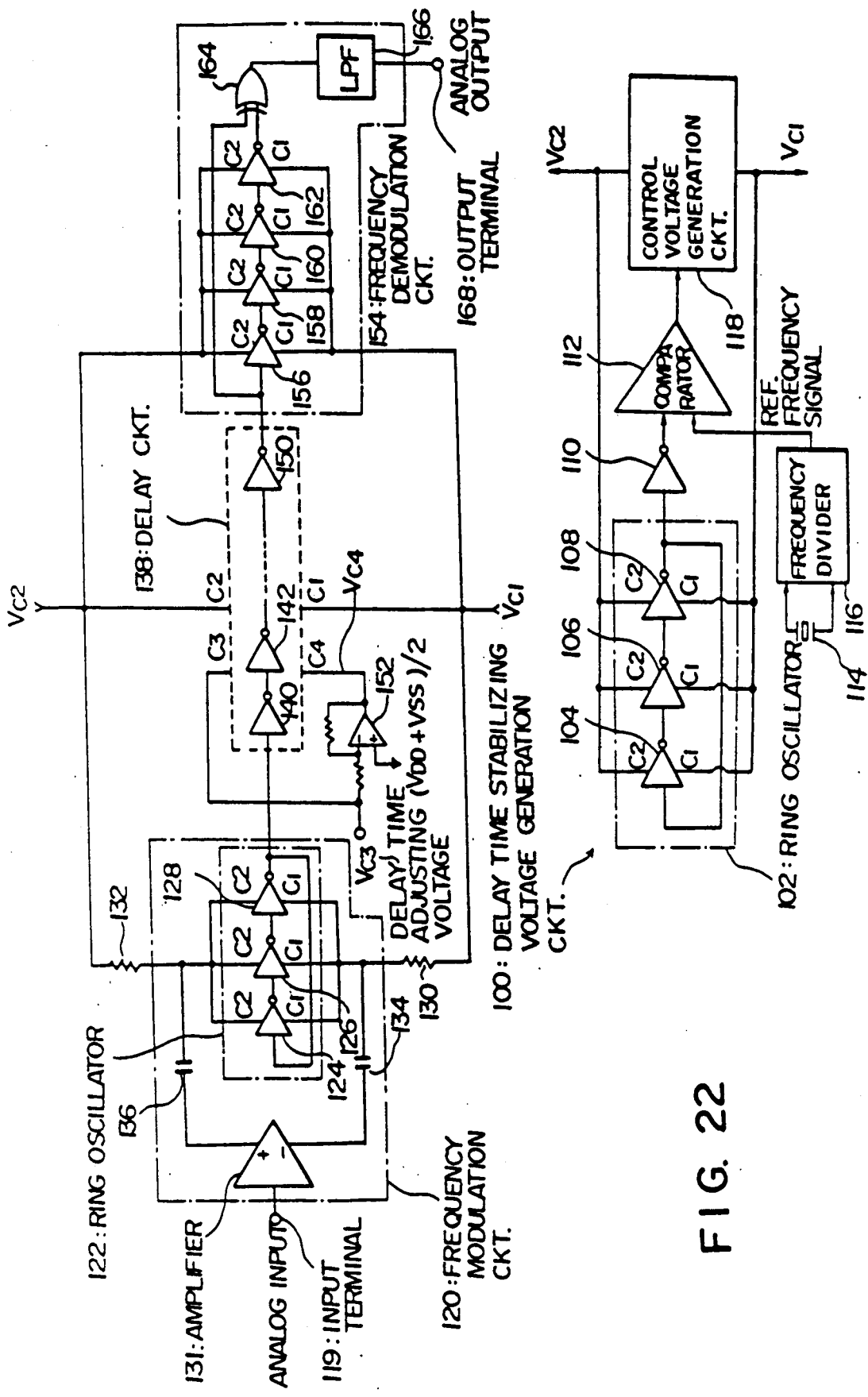
FIG. 22 is a circuit diagram showing an embodiment of the analog delay circuit according to the invention.

FIG. 22 shows an embodiment of the analog delay circuit according to the invention. In FIG. 22, all inverters are composed of CMOS inverters and are placed under conditions of the same temperature and power voltages $V_{DD}$ and $V_{SS}$ (e.g., on the same substrate). In FIG. 22, illustration of the power voltages $V_{DD}$ and $V_{SS}$ is omitted.

A delay time stabilizing voltage generation circuit 100 is a circuit provided for generating control voltages Vc1 and Vc2 which are used for providing a constant delay time to the respective inverters in FIG. 22. In the delay time stabilizing voltage generation circuit 100, a ring oscillator 102 utilizing the delay characteristics of the inverters is composed by cascade-connecting inverters 104, 106 and 108 of an odd number and feeding back the output of the final stage inverter 108 to the initial stage inverter 104. The respective inverters 104, 106 and 108 are constructed, for example, as the one shown in FIG. 1. Upon application of a signal "1" or "0" to the initial inverter 104, this signal is delayed through the inverters 104, 106 and 108 and a signal which is of an inverted level is provided from the final stage inverter 108 after lapse of a predetermined period of time. This signal is fed back to the initial stage inverter 104. Accordingly, the same operation is repeated with the input to the initial stage being inverted and oscillation thereby is produced. The oscillation frequency of the ring oscillator 102 is determined by the delay time of the open loop. Since the delay time of the inverters is controlled by the power voltage as described above, the oscillation frequency of the ring oscillator 102 is controlled by the inverters 104, 106 and 108.

The oscillation output of the ring oscillator 102 is waveshaped in an inverter 110 and thereafter is applied to a comparator 112. The comparator 112 compares, in phase and frequency, the output signal of the inverter 110 with a reference frequency signal obtained by frequency-dividing an oscillation signal of a crystal oscillator 114 by a frequency divider 116 and thereupon produces a pulse signal having a pulse width corresponding to difference of the two signals. A control voltage generation circuit 118 generates DC voltages Vc1 and Vc2 by smoothing the output pulse of the comparator 112. The DC voltages Vc1 and Vc2 are applied to control input terminals c1 and c2 of the inverters 104, 106 and 108 which constitute the ring oscillator 102 to control voltages applied thereto. Since the delay characteristics of the inverters 104, 106 and 108 depend upon the applied voltage, a phase-locked loop is constituted by the above described construction and a very stable oscillation frequency which is substantially equivalent to the reference frequency is obtained. In other words, the delay time of the respective inverters 104, 106 and 108 is controlled to a constant delay time regardless of variations in the power voltage and temperature.

By utilizing the control voltages Vc1 and Vc2 provided by the control voltage generation circuit 118 as control voltage for other inverters placed under the same temperature and power voltage ($V_{DD}$, $V_{SS}$) conditions, a delay which is not affected by the variations in temperature and power voltage can be realized.

The analog signal which is a signal to be delayed is applied from an input terminal 119 to an FM modulation circuit 120. The FM modulation circuit 120 comprises a ring oscillator 122 which is composed of cascade-connected inverters 124, 126 and 128 with the output of the final stage inverter 128 being fed back to the initial stage inverter 124. These inverters 124, 126 and 128 are constructed, for example, as the one shown in FIG. 1. To control inputs c1 and c2 of the inverters 124, 126 and 128 are applied the control voltages Vc1 and Vc2 for stabilizing the delay time through resistors 130 and 132. The analog signal applied from the input terminal 119 is superposed upon the control voltages Vc1 and Vc2 through an amplifier 131 and capacitors 134 and 136. Accordingly, voltages applied to the inverters 124, 126 and 128 are modulated by the input analog signal and a pulse signal of a frequency corresponding to the level of the input analog signal is produced from the ring oscillator 122. That is, a signal derived by pulse frequency-modulating the input analog signal is provided from the ring oscillator.

The output signal of the ring oscillator 122 is delivered out of the FM modulation circuit 120 and applied to a delay circuit 138. The delay circuit 138 is of a two-channel control system composed of cascade-connected inverters 140, 142, . . . , 150. The construction as shown in FIG. 13 can preferably be employed as the delay circuit 138. One of the two control systems is used for controlling by the control voltages Vc1 and Vc2 for stabilizing the delay time. The other control system is used for adjusting the delay time by delay time adjusting voltage Vc3. The delay time adjusting voltage Vc3 is applied directly to a control input c3 (FIG. 13). This voltage Vc3 is also inverted by an inverting amplifier 152 using an intermediate voltage $$\frac{V_{DD} + V_{SS}}{2}$$

between the power voltage $V_{DD}$ and $V_{SS}$ as a reference to prepare voltage Vc4 (Vc4=$V_{DD}$+$V_{SS}$−Vc3) and this voltage Vc4 is applied to a control terminal c4 (FIG. 13).

In the above described manner, the delay time is continuously adjusted by the adjusting voltage Vc3.

The output of the delay circuit 138 is applied to a frequency demodulation circuit (i.e., pulse count detection circuit) 154. In the frequency demodulation circuit 154, a signal to be demodulated from the delay circuit 138 is applied to a circuit consisting of cascade-connected inverters 156, 158, 159 and 160 of an even number (four in the illustrated example), the output signal from the final stage inverter 162 is applied to an exclusive OR gate 164 and the output of the exclusive OR gate 164 is smoothed by a low-pass filter 166 and delivered to an output terminal 168 as a demodulated signal. By controlling voltages applied to the inverters 156 through 162 by the control voltages Vc1 and Vc2, an accurate, distortionless pulse frequency demodulation can be performed.

The operation of the circuit of FIG. 22 is shown in FIGS. 23a–23d. An analog signal as shown in FIG. 23a is applied to the input terminal 119. This signal is pulse frequency-modulated by the FM modulation circuit 120 into a signal as shown in FIG. 23b which has a frequency corresponding to the voltage level. The output signal of the FM modulation circuit 120 is delayed by the delay circuit into a signal as shown in FIG. 23c. This delayed signal is pulse frequency-demodulated by the frequency demodulation circuit 154 and a delay analog signal as shown in FIG. 23d is provided from the output terminal 168. The delay time T is variably controlled by the adjusting voltage Vc3. Since the delay time T of the respective inverters is controlled by control voltages Vc1 and Vc2 so as not to be affected by temperature and power voltages, a stable and accurate delay can be performed.

According to this analog delay circuit, an analog signal is delayed through the pulse frequency modulation, the delay by the CMOS gate and the pulse frequency demodulation. Since no sampling by a clock pulse as in the bucket-brigade device or charge-coupled device is required, delaying of a signal with a high resolution and therefore with little distortion can be realized. Further, the delay time can be continuously controlled by controlling voltage applied to the CMOS gate.

I claim:

1. A signal delay circuit for delaying analog signals comprising:
   (a) frequency modulation means for receiving an analog signal to be delayed, performing a pulse frequency-modulation operation using the analog signal to provide a frequency-modulated pulse signal whose frequency corresponds to the value of the analog signal, and outputting the frequency-modulated pulse signal;
   (b) signal delay means for receiving and delaying the pulse signal, the signal delay means including:
      i) CMOS gate circuit means having an input terminal to which the pulse signal is applied, an output terminal from which a delayed pulse signal is derived, and power voltage supply terminals to which operation power voltages are applied;
      ii) voltage control means, located in a power supply path for the CMOS gate circuit means, for controlling the power voltage applied to the CMOS gate circuit means in response to a control signal thereby to control the amount of delay imparted to the pulse signal; and
      iii) means for providing the control signal to the voltage control means; and
   (c) frequency demodulation means for receiving the delayed pulse signal and pulse frequency-demodulating the received signal, the output signal of said frequency demodulation means constituting a delayed analog signal corresponding to the analog input signal.

2. A circuit as defined in claim 1, wherein the CMOS gate circuit means comprises a series of CMOS gates each including a pair of complementary MOS transistors with interconnected gates which receive a common input signal.

3. A circuit as defined in claim 1 wherein the CMOS gate circuit means includes plural CMOS gates and the voltage control means includes plural MOS-FET's and wherein the CMOS gates and the MOS-FET's are formed on a same substrate under a same environment.

4. An analog signal delay circuit as defined in claim 1 wherein said frequency modulation means comprises a CMOS gate circuit including plural CMOS gates connected in series in a loop in plural stages and operating as a ring oscillator, the analog signal to be delayed being applied to said CMOS gate circuit to modulate an operation power voltage applied to power the CMOS gates of said CMOS gate circuit and the frequency-modulated pulse signal being derived from a predetermined output of said CMOS gates.

5. An analog signal delay circuit as defined in claim 1 wherein said frequency demodulation means comprises:
 a CMOS gate circuit including plural CMOS gates connected in series in plural stages receiving the output signal of said frequency modulation means after having been delayed by said signal delay means;
 an exclusive OR gate receiving input and output signals of said CMOS gate circuit; and
 a low pass filter circuit connected to the output of said exclusive OR gate, the output of said low-pass filter circuit being derived as the delayed analog signal.

6. A circuit as defined in claim 5 wherein the CMOS gate circuit of the frequency demodulation means includes plural CMOS gates and the MOS-FET's of said CMOS gate circuit means of the signal delay means are formed on a same substrate under a same environment.

7. A signal delay circuit as defined in claim 1 wherein the frequency modulation means and frequency demodulation means each includes a CMOS gate circuit including a plurality of CMOS gates connected in series, the signal delay circuit further comprising:
 a ring oscillator including a CMOS gate circuit including a plurality of CMOS gates connected in series in a loop in plural stages and producing an oscillation output from a predetermined output of said CMOS gates;
 reference frequency signal generation means for generating a reference signal of a constant frequency;
 comparator means for comparing in phase the reference signal with the output signal of said ring oscillator; and
 control voltage generation means for generating a control voltage corresponding to a result of comparison in said comparator means and applying the generated control voltage to said CMOS gate circuit of the ring oscillator to control the operation power voltage of the CMOS gate circuit;
 the application of said control voltage constituting a phase-locked loop so as to stabilize the frequency of the output signal of the ring oscillator, said control voltage also being supplied to the CMOS gate circuits of said frequency modulation means, signal delay means and frequency demodulation means to control the operation voltage of the CMOS gate circuits of each and wherein the CMOS gate circuits of said ring oscillator, frequency modulation means, signal delay means and frequency demodulation means are subjected to the same temperature condition.

* * * * *

UNITED STATES PATENT AND TRADEMARK OFFICE
CERTIFICATE OF CORRECTION

PATENT NO. : 5,039,893

DATED : August 13, 1991

INVENTOR(S) : Norio Tomisawa

It is certified that error appears in the above-identified patent and that said Letters Patent is hereby corrected as shown below:

On the title page: Item,
[30] Foreign Application Priority Data

```
Jul. 31, 1984  [JP]    Japan................59-160784
Jul. 31, 1984  [JP]    Japan................59-160785
Jul. 31, 1984  [JP]    Japan................59-160786
Dec. 18, 1984  [JP]    Japan................59-267050
Dec. 21, 1984  [JP]    Japan................59-270431
Nov. 26, 1984  [JP]    Japan................59-179551
```

Signed and Sealed this

Sixth Day of April, 1993

Attest:

STEPHEN G. KUNIN

*Attesting Officer*  Acting Commissioner of Patents and Trademarks